United States Patent
Basol et al.

(10) Patent No.: US 6,866,763 B2
(45) Date of Patent: Mar. 15, 2005

(54) METHOD AND SYSTEM MONITORING AND CONTROLLING FILM THICKNESS PROFILE DURING PLATING AND ELECTROETCHING

(75) Inventors: Bulent M. Basol, Manhattan Beach, CA (US); Cyprian E. Uzoh, San Jose, CA (US)

(73) Assignee: ASM NuTool, Inc., Fremont, CA (US)

( * ) Notice: Subject to any disclaimer, the term of this patent is extended or adjusted under 35 U.S.C. 154(b) by 8 days.

(21) Appl. No.: 10/427,309

(22) Filed: Apr. 30, 2003

(65) Prior Publication Data

US 2003/0230491 A1 Dec. 18, 2003

Related U.S. Application Data

(63) Continuation-in-part of application No. 09/760,757, filed on Jan. 17, 2001, now Pat. No. 6,610,190.
(60) Provisional application No. 60/377,081, filed on Apr. 30, 2002.

(51) Int. Cl.[7] .................. C25D 21/12; C25D 17/00; C25F 3/00; C25F 7/00
(52) U.S. Cl. .................. 205/84; 205/645; 204/224 M; 204/224 R; 204/297.05
(58) Field of Search .................. 205/84, 641, 645; 204/641, DIG. 7, 224 R, 224 M, 297.05

(56) References Cited

U.S. PATENT DOCUMENTS

| | | |
|---|---|---|
| 3,328,273 A | 6/1967 | Creutz et al. .................. 204/52 |
| 4,430,173 A | 2/1984 | Boudot et al. ............ 204/52 R |
| 4,948,474 A | 8/1990 | Miljkovic .................. 204/52.1 |
| 4,954,142 A | 9/1990 | Carr et al. ..................... 51/309 |
| 4,975,159 A | 12/1990 | Dahms ........................ 204/15 |

(List continued on next page.)

FOREIGN PATENT DOCUMENTS

| | | |
|---|---|---|
| WO | WO 98/27585 | 6/1998 |
| WO | WO 00/26443 | 5/2000 |
| WO | 1 037 263 A2 | 9/2000 |

OTHER PUBLICATIONS

Robert D. Mikkola et al., "Investigation of the roles of the additive components for second generation copper electroplating chemistries used for advanced interconnect metallization", 2000 IEEE, IEEE Electron Devices Society, pp. 117–119, U.S. Appl. No. 09/760,757, no month and year provided.
James J. Kelly et al., "Leveling and Microstructural Effects of Additives for Copper Electrodeposition", Journal of the Electrochemical Society, 146 (7), 1999, pp. 2504–2545, U.S. Appl. No. 09/760,757, no month and year provided.
Joseph M. Steigerwald et al., "Chemical Mechanical Planarization of Microelectronic Materials", A Wiley–Interscience Publication, 1997, by John Wiley & Sons, Inc. pp. 212–222, U.S. Appl. No. 09/760,757, no month and year provided.

*Primary Examiner*—Patrick Ryan
*Assistant Examiner*—Thomas H. Parsons
(74) *Attorney, Agent, or Firm*—Knobbe, Martens, Olson-Bear LLP

(57) ABSTRACT

The present invention provides method of adjusting a thickness profile of a top metal layer of a workpiece using a processing solution. A thickness profile control member is included that has at least first and second regions that will allow for processing at respective first and second rates that are different from each other. When processing the workpiece, the processing system establishes relative lateral movement between the workpiece and the thickness profile control member so that a certain portion of the workpiece is disposed in locations that correspond to the first and second regions at different points in time during the processing. In a preferred aspect, the lateral movement is controlled as a result of data obtained from sensors relating to the thickness of a removed or deposited layer.

31 Claims, 6 Drawing Sheets

U.S. PATENT DOCUMENTS

| | | |
|---|---|---|
| 5,084,071 A | 1/1992 | Nenadic et al. ............... 51/309 |
| 5,256,565 A | 10/1993 | Bernhardt et al. .......... 437/228 |
| 5,354,490 A | 10/1994 | Yu et al. .................... 257/79.1 |
| 5,516,412 A | 5/1996 | Andricacos et al. .... 204/224 R |
| 5,681,215 A | 10/1997 | Sherwood et al. ......... 451/388 |
| 5,755,859 A | 5/1998 | Brusic et al. ............. 106/1.22 |
| 5,762,544 A | 6/1998 | Zuniga et al. .............. 451/285 |
| 5,770,095 A | 6/1998 | Sasaki et al. ................. 216/38 |
| 5,773,364 A | 6/1998 | Farkas et al. ............... 438/692 |
| 5,793,272 A | 8/1998 | Burghartz et al. ......... 336/200 |
| 5,795,215 A | 8/1998 | Guthrie et al. ............. 451/286 |
| 5,807,165 A | 9/1998 | Uzoh et al. .................... 451/41 |
| 5,840,629 A | 11/1998 | Carpio ...................... 438/692 |
| 5,858,813 A | 1/1999 | Scherber et al. ........... 438/693 |
| 5,884,990 A | 3/1999 | Burghartz et al. ......... 336/200 |
| 5,897,375 A | 4/1999 | Watts et al. ................ 438/639 |
| 5,911,619 A | 6/1999 | Uzoh et al. ..................... 451/5 |
| 5,922,091 A | 7/1999 | Tsai et al. ..................... 51/306 |
| 5,930,669 A | 7/1999 | Uzoh ......................... 438/627 |
| 5,933,753 A | 8/1999 | Simon et al. ............... 438/629 |
| 5,954,997 A | 9/1999 | Kaufman et al. ........... 257/79.1 |
| 5,976,331 A | 11/1999 | Chang et al. ............ 204/224 R |
| 5,985,123 A | 11/1999 | Koon ........................... 205/96 |
| 6,001,235 A | 12/1999 | Arken et al. ................. 205/137 |
| 6,004,880 A | 12/1999 | Liu et al. ..................... 438/692 |
| 6,027,631 A | 2/2000 | Broadbent .................. 205/137 |
| 6,063,506 A | 5/2000 | Andricacos et al. ........ 428/546 |
| 6,066,030 A | 5/2000 | Uzoh ........................... 451/41 |
| 6,071,388 A | 6/2000 | Uzoh ......................... 204/297 |
| 6,074,544 A | 6/2000 | Reid et al. ................... 205/157 |
| 6,103,085 A | 8/2000 | Woo et al. ................... 205/143 |
| 6,132,587 A | 10/2000 | Jorne et al. ................. 205/123 |
| 6,136,163 A | 10/2000 | Cheung et al. ............. 204/198 |
| 6,156,167 A | 12/2000 | Patton et al. ............... 204/270 |
| 6,159,354 A | 12/2000 | Contolini et al. ............ 205/96 |
| 6,162,344 A | 12/2000 | Reid et al. ................... 205/152 |
| 6,176,992 B1 | 1/2001 | Talieh ......................... 205/97 |
| 6,261,426 B1 | 7/2001 | Uzoh et al. ............. 204/224 R |
| 2002/0070126 A1 * | 6/2002 | Sato et al. ................... 205/640 |

\* cited by examiner

METHOD AND SYSTEM MONITORING AND CONTROLLING FILM THICKNESS PROFILE DURING PLATING AND ELECTROETCHING

RELATED APPLICATIONS

This application is a continuation in part of U.S. patent application Ser. No. 09/760,757 (NT-200) filed Jan. 17, 2001, now U.S. Pat. No. 6,610,190, which is expressly incorporated by reference herein. This application claims priority from U.S. Provisional Application Ser. No. 60/377,081 filed Apr. 30, 2002, which is expressly incorporated by reference herein.

FIELD

The present invention relates to manufacture of semiconductor integrated circuits and, more particularly to a method for planar deposition or etching of conductive layers.

BACKGROUND

Conventional semiconductor devices generally include a semiconductor substrate, usually a silicon substrate, and a plurality of sequentially formed dielectric interlayers such as silicon dioxide and conductive paths or interconnects made of conductive materials. Copper and copper alloys have recently received considerable attention as interconnect materials because of their superior electromigration and low resistivity characteristics. Interconnects are usually formed by filling copper in features or cavities etched into the dielectric interlayers by a metallization process. The preferred method of copper metallization process is electroplating. In an integrated circuit, multiple levels of interconnect networks laterally extend with respect to the substrate surface. Interconnects formed in sequential interlayers can be electrically connected using vias or contacts.

In a typical electroplating process for integrated circuit applications, first an insulating interlayer is formed on the semiconductor substrate. Patterning and etching processes are performed to form interconnect features such as trenches and vias in the insulating layer. Following the deposition of a barrier layer such as Ta or TaN and a copper seed layer, copper is electroplated to fill all the features. The electroplated layer is then etched back or polished to form conductive interconnect or other structures.

Controlling the thickness profile of the plated layer is one of the important issues for the electroplating technology. In general, the thickness of the electroplated layer is controlled to be as uniform as possible. The uniform thickness profile of the plated layer reduces subsequent CMP process time and increases throughput. However, it will be attractive to selectively vary the thickness profile of the plated layer across the selected locations of the wafer surface. This is due to the fact that some etching or polishing processes, such as electroetching and CMP, may result in non-uniform polishing rates at different locations of the wafer, as the electroplated layer is electroetched or polished. By forming non-uniform thickness profiles at such corresponding locations of the wafer, the differences in electroetching rate or CMP polishing rate across the wafer may be compensated.

To this end, there is need for an improved method and apparatus for controlling the thickness profile of the plated or etched layers during metal deposition or electroetching processes.

SUMMARY

It is an advantage of the present invention to provide a method and system that can obtain a desired thickness profile to a top conductive surface of a workpiece.

It is a further advantage of the present invention to provide a method and system that can obtain a planar surface to a workpiece that previously had a non-planar surface.

It is a further advantage of the present invention to provide a method and system that can use continuously obtained data relating to processing of a workpiece to alter the position of the workpiece relative to a thickness profile control member that has at least two regions that will provide for different amounts of processing.

The above advantages, either singly or in combination, among others, are achieved by different aspects of the present invention.

According to one aspect, the present invention provides method of adjusting a thickness profile of a top metal layer of a workpiece using a processing solution. A thickness profile control member is included that has at least first and second regions that will allow for processing at respective first and second rates that are different from each other. When processing the workpiece, the processing system establishes relative lateral movement between the workpiece and thickness profile control member so that a certain portion of the workpiece is disposed in locations that correspond to the first and second regions at different points in time during the processing.

In a preferred aspect, the lateral movement is controlled as a result of data obtained from sensors relating to the thickness of a removed or deposited layer.

The above and other aspects of the present invention will be further described herein.

BRIEF DESCRIPTION OF THE DRAWINGS

The above and other objectives, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION

As will be described below, the present invention provides an in-situ thickness profile control method and system for electroplating and electroetching processes. The thickness profile control system of the present invention uses a thickness profile control member in conjunction with a thickness profile control unit, which is a computerized control unit, to control and maintain selected thickness profile of a processed surface using its real time thickness measuring capability. Selected thickness profile may be a uniform thickness profile or a non-uniform thickness profile having varying thickness on the workpiece. Based on the derived real-time thickness data from the surface of the wafer that is preferably continuously received and processed, the thickness profile control system forms a layer with desired thickness profile during plating or etching processes using a thickness profile control member.

In accordance with the principles of the present invention the thickness profile control member may be any means that is capable of varying the rate of electroplating or electroetching on a substrate as a function of location or distance and thereby controlling the thickness profile of the deposited or etched layer as a function of location or distance, as will become apparent hereinafter.

Figure 1A:
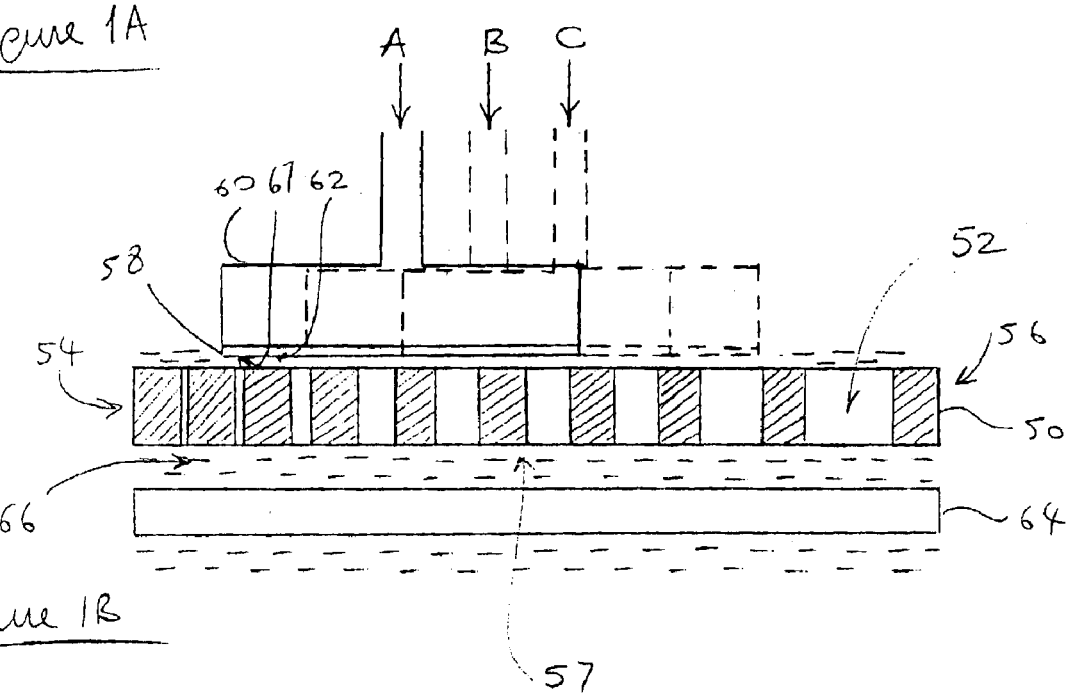
FIGS. 1A and 2A illustrate various embodiments of the present invention.

As shown in FIG. 1A, in one example, the thickness profile control member may be a perforated plate 50 having openings 52. The distribution of the openings is configured in such way that there are small openings near a first end 54 and large openings near a second end 56 of the plate 50. Intermediate size openings may occupy a central location 57 of the perforated plate. A wafer 58 to be processed, i.e., electroplated or electroetched, is held by a wafer carrier 60 that can rotate the wafer 58 and also translate it in a direction substantially parallel to the surface 62 of the wafer 58.

During the process, a potential difference is applied between the wafer surface and an electrode 64 while a process solution 66 wets the electrode and the wafer surface. If the process is electrodeposition, the perforated plate 50 shapes the deposition rate. If the process is electropolishing or electroetching the plate 50 shapes the material removal rate. It will be appreciated that under normal conditions, deposition rate on regions of a wafer 58 that are plated above the large openings of the perforated plate 50 would be higher than other regions of the wafer 58 that are placed above the small openings of the perforated plate 50.

Figure 1B:
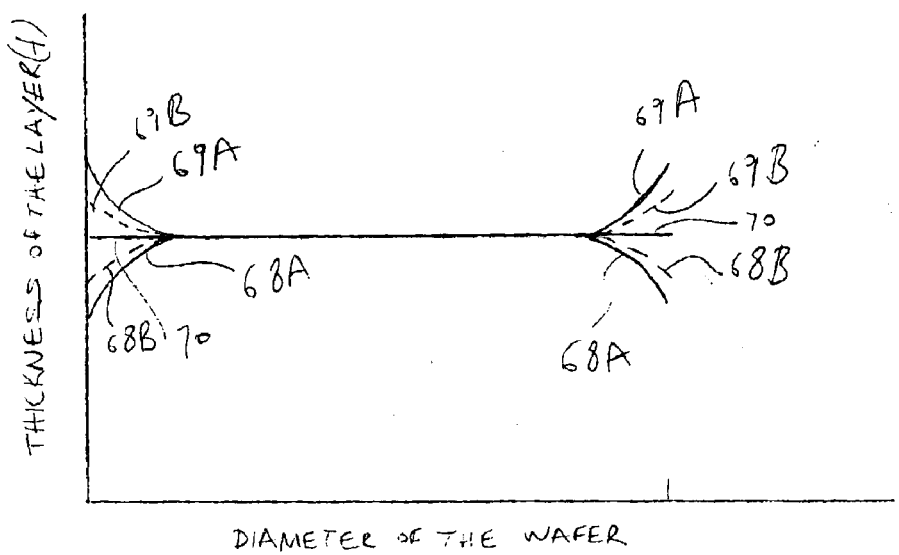
FIGS. 1B and 2B illustrate various representative thickness profiles achievable using the embodiments of the present invention.

Referring to FIG. 1A, in an exemplary operation sequence, as the wafer carrier 60 is rotated about an axis depicted by arrow A, an edge region 67 of the wafer 58 is exposed to the process solution that flows from the small and intermediate size openings of the plate 50, whereas the center region of the wafer 58 is exposed to process solution that flows from openings that are only intermediate size openings. As a result of being exposed to low deposition rate at the edge region 67 as compared to the center region of the wafer 58, the copper layer at the edge region grows slower than the center region on the surface 62 of the wafer 58. The curves 68A and 68B in FIG. 1B schematically show exemplary resulting thickness profiles of the deposited layer, also known as "edge low profiles," as compared against a reference flat profile 70. This edge low profile can be obtained by either plating the wafer 58 at position A (in which case a profile such as 68A could be obtained) or by scanning it between the positions A and B (which can be used to flatten the profile, such as illustrated by profile 68B).

If, however, the carrier 60 was moved towards the second end 56 of the plate 50 and the edge region 67 of the wafer 68 was positioned above the large and intermediate openings, whereas the center region was positioned above relatively smaller openings, such as only intermediate size openings, the deposition rate at the edge region 67 would be higher than the center region of the wafer 58. Curves 69A and 69B in FIG. 1B show exemplary resulting thickness profiles of the deposited layer, which are edge high profiles and can be obtained by rotating the wafer about an axis C (in which case a profile such as 69A could be obtained) or scanning it between the positions B and C while rotating it (which can be used to flatten the profile, such as illustrated by profile 69B). The flat profile 70 in FIG. 1B, which is a uniform thickness profile on the surface 62 of the wafer 58 may be obtained by rotating the wafer 58 about an axis B or laterally scanning the wafer around position B while at the same time rotating it.

Although the above description is in terms of deposition, it will be apparent that if etching or polishing were being performed instead of deposition, the rate of etching will be greater or lesser depending upon the distribution of openings in the plate 50, in the same manner as described above. If etching is performed, the resulting thickness profile can also be represented by FIG. 1B, with the curves 68 indicative of a greater etch rate and the curves 69 indicative of a lesser etch rate at the edges of the wafer.

By spending more or less time at either position A or C, many variations of thickness profiles, in between the two which are exemplarily illustrated by the curves 68 and 69 in FIG. 1B, can be obtained.

It should be noted that similar results may be obtained by keeping the wafer stationary and by laterally moving and rotating the thickness profile control member relative to the stationary wafer. Similarly wafer may be kept stationary in lateral direction, it may, however be rotated while the thickness profile control member is translated to the right and/or left to obtain the results described above. In other words, the invention requires a thickness profile control member that introduces deposition or etching rate change along at least one direction in space and a means of relative motion between the wafer and the thickness profile control member during deposition and/or etching, in that at least one direction, to control the resulting thickness profile on the wafer.

In this exemplary embodiment, although the thickness profile control member is a perforated plate having holes or openings in varying sizes to introduce regions of low and high deposition rates above the plate, deposition or etching rate gradients may be obtained by many other ways. For example, the plate 50 in FIG. 1A may have openings having substantially the same size and substantially the same density, but the amount of process solution flow from various openings in various locations may be varied with respect to each other to obtain the various deposition or etching profiles as described above. The solution may be flowed at low rate from openings on the left for example, giving rise to lower deposition or etching rates in those regions when a portion of the substrate is placed above them. Solution may be flowed at higher rates through the openings on the right creating on the right a higher deposition or etching rate region. Similar results depicted in FIG. 1B can also be obtained.

Figure 2A:
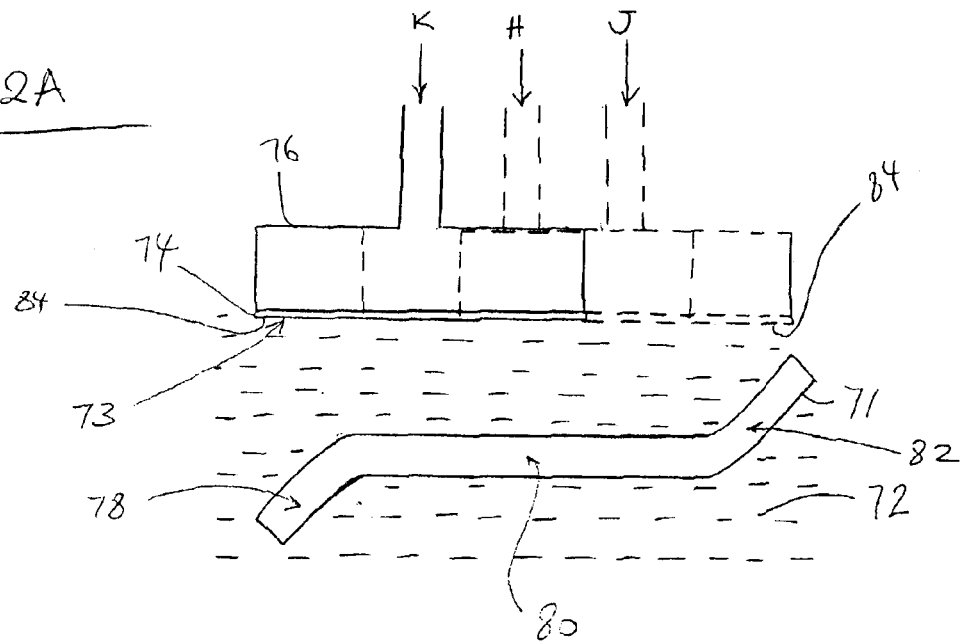

As shown in FIG. 2A, in another example, the thickness profile control member may be an electrode 71 that is immersed in a process solution 72, or a combination of the electrode 71 and the plate 50 previously discussed with reference to FIG. 1A. The electrode 71 is capable of varying deposition rates across a front surface 73 of a wafer 74 as the wafer is rotated and laterally moved above the electrode 71 by a wafer carrier 76 while an electrical potential is applied between the electrode and the wafer. In this embodiment, shape of the electrode 71 enables the electrode to vary deposition rates across the front surface of the wafer. In this respect, the electrode is shaped to have, but not limited to, a low deposition portion 78, an intermediate deposition portion 80 as well as a high deposition portion 82, in which the distance between the portion of the electrode and wafer surface varies, such that the low deposition portion 78 is at a greater distance from the surface of the wafer 74 than the high deposition portion 82. The low deposition portion 78 may be downwardly slanted with respect to the intermediate deposition portion 80 of the electrode 71. Compared to the other portions 80 and 82, the low deposition portion 78 is farther away from an edge region 84 of the wafer 74 when the wafer is laterally moved to a position 'K'. At position 'K', electrical current flow is the lowest compared with positions 'H' and 'J', hence the lowest deposition rate, to the front surface 73 occurs at the wafer edge. The intermediate deposition portion 80 of the electrode may be substantially parallel to the front surface 73 of the wafer 74, and thereby when the wafer is laterally moved to a position H, the front surface may receive a uniform deposition rate. The high deposition portion 82 of the electrode is slanted upwardly with respect to the intermediate deposition portion so that the portion 82 is the closest portion to the edge region 84 of the wafer when the wafer is laterally moved to a position 'J'. At position 'J', the edge region 84 of the wafer receives higher electrical current flow and thus higher deposition rate yielding an edge high profile.

Figure 2B:
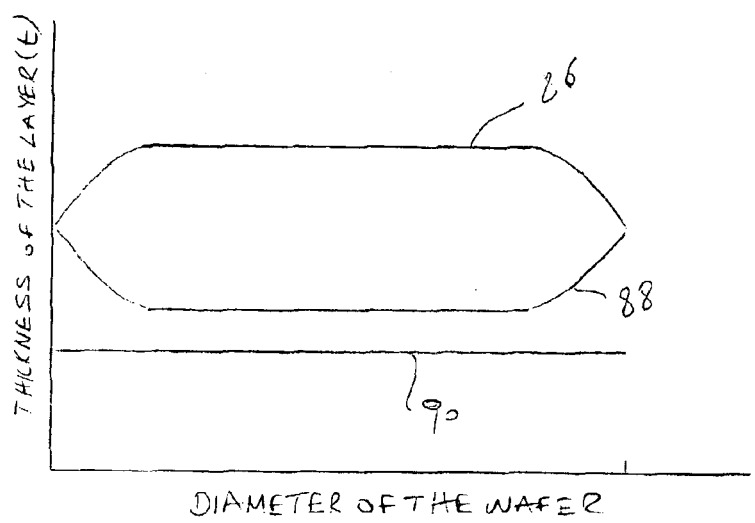

Referring to FIG. 2A, in an exemplary operation sequence, as the wafer carrier 76 is rotated about an axis 'K', the edge region 84 of the wafer 74 receives a low plating current density as compared to the center region of the wafer 74. As a result, the copper layer at the edge region 84 grows slower than the center region on the surface 73 of the wafer. The curve 86 in FIG. 2B shows an exemplary resulting thickness profile of the deposited layer, also known as "edge low profile". Such a profile may be obtained by either plating the wafer at position 'K' or laterally scanning between the positions 'K' and 'H' while rotating it. However, at the position J, when the edge region is positioned above the high deposition portion 82, deposition rate at the edge region 84 will be higher than the center region of the wafer. Curve 88 in FIG. 2B shows an exemplary resulting thickness profile of the deposited layer, which is an edge high profile and can be obtained by rotating the wafer about an axis J or laterally scanning it between the positions H and J while rotating it. As represented by curve 90 in FIG. 2B, a uniform thickness profile on the surface 73 of the wafer 74 may be obtained by rotating the wafer about an axis H or laterally scanning the wafer around the position H. It can be appreciated that the degree of edge high or edge low profiles may be adjusted by adjusting the scan of the wafer to the left or to the right. Therefore, the present invention offers a variable, or "knob," to adjust the thickness profile of a film on a wafer. This variable or knob is lateral movement, which can be controlled. If the thickness of the film on the various portions of the wafer can be monitored in-situ, a feedback loop can then provide input to a computer, which can control the lateral movement to affect the resulting thickness profile. This aspect of the invention will be discussed next using another example.

The examples above employed electrochemical deposition (ECD) and electrochemical etching/polishing applications. The present invention can also be described by employing an Electrochemical Mechanical Processing (ECMPR) approach that has the ability to provide thin layers of planar conductive material on the workpiece surface, or even provide a workpiece surface with no or little excess conductive material. The term Electrochemical Mechanical Processing (ECMPR) is used to include both Electrochemical Mechanical Deposition (ECMD) processes as well as Electrochemical Mechanical Etching (EGME) processes, which are also called Electrochemical Mechanical Polishing (ECMP). It should be noted that in general both ECMD and ECME processes are referred to as electrochemical mechanical processing (ECMPR) since both involve electrochemical processes and mechanical action.

Descriptions of various planar deposition and planar etching methods i.e. ECMPR approaches and apparatus can be found in the following patents and pending applications, all commonly owned by the assignee of the present invention: U.S. Pat. No. 6,126,992 entitled "Method and Apparatus for Electrochemical Mechanical Deposition," U.S. application Ser. No. 09/740,701 entitled "Plating Method and Apparatus that Creates a Differential Between Additive Disposed on a Top Surface and a Cavity Surface of a Workpiece Using an External Influence," filed on Dec. 18, 2001, now U.S. Pat. No. 6,534,116, and U.S. Application filed on Sep. 20, 2001, with serial number 09/961,193 entitled "Plating Method and Apparatus for Controlling Deposition on Predetermined Portions of a Workpiece." These methods can deposit metals in and over cavity sections on a workpiece and etch metals from a surface of a workpiece in a planar manner. U.S. Application with Ser. No. 09/960,236 filed on Sep. 20, 3301, entitled "Mask Plate Design," and U.S. Provisional Application with Ser. No. 60/326,087 filed on Sep. 28, 2001, entitled "Low Force Electrochemical Mechanical Processing Method and Apparatus," both assigned to the same assignee as the present invention provide further details with respect to certain aspects of ECMPR processes that may be useful in conjunction with the present invention.

Figure 3:
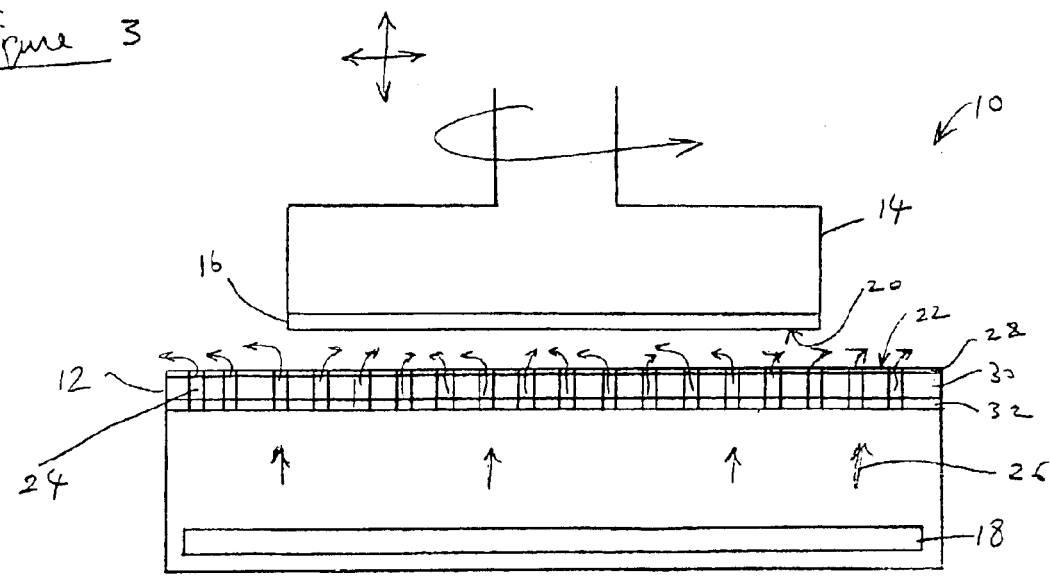
FIG. 3 illustrates an exemplary ECMPR system that can be used with the present invention.

FIG. 3 shows an exemplary conventional ECMPR system 10, which includes a workpiece-surface-influencing device (WSID) 12 such as a mask, pad or a sweeper, a carrier head 14 holding a workpiece 16 or wafer and an electrode 18. The wafer can be a silicon wafer to be plated copper using the ECMPR system or it can be a copper plated wafer to be electroetched using the ECMPR. The WSID 12 is used during at least a portion of the ECMPR process when there is physical contact or close proximity and relative motion between a surface 20 of the wafer 16 and the WSID 12. A top surface 22 of the WSID 12 sweeps the surface 20 of the wafer 16 while an electrical potential is established between the electrode 18 and the surface of the wafer. The electrical contact with the surface of the wafer is established through contacts touching the edge of the wafer. Channels 24 or openings of the WSID allow a process solution 26 such as a copper electrolyte to flow to the surface of the wafer. The channels may have varying size and shapes to control the uniformity of the planar layer that is being deposited or removed. The WSID 12 is basically composed of a top layer 28, which is made of a flexible film, and a compressible layer 30 that is made of a spongy and compressible material. The top layer 28 may be an abrasive film. The WSID 12 is typically supported by a rigid support plate 32.

If the ECMD process is carried out to plate copper onto the wafer in the ECMPR system, the surface of the wafer is wetted by a deposition electrolyte that is also in fluid contact with the electrode (anode) and a potential is applied between the surface of the wafer and the electrode rendering the wafer surface cathodic. If the ECME or ECMP process is carried out, the surface of the wafer is wetted by the deposition electrolyte or a special etching electrolyte, which is also in fluid contact with an electrode (cathode during the etching) and a potential is applied between the surface of the wafer and the electrode rendering the wafer surface anodic. Thus, etching takes place on the wafer surface.

The ECMPR systems are capable of performing planar or non-planar plating as well as planar or non-planar electroetching. If non-planar process approach is chosen, the front surface of a wafer is brought into proximity of the top of the WSID, but it does not touch it, so that non-planar metal deposition can be performed. Further, if a planar process approach is chosen, the front surface of the wafer preferably contacts the WSID surface as a relative motion is established between the WSID surface and the wafer surface. As the electrolyte solution, depicted by arrows, is delivered through the channels of the WSID, the wafer is moved, i.e., rotated and laterally moved, while the front surface contacts the WSID. Under an applied potential between the wafer and an electrode, and in the presence of the solution that rises through the WSID, the metal such as copper, is plated on or etched off the front surface of the wafer depending on the polarity of the voltage applied between the wafer surface and the electrode.

During the process, the wafer surface is pushed against the surface of the WSID or vice versa, at least part of the process time, when the surface of the workpiece is swept by the WSID. Deposition of a thin and planar layer is achieved due to the sweeping action as described in the above-cited patent applications.

Figure 4:
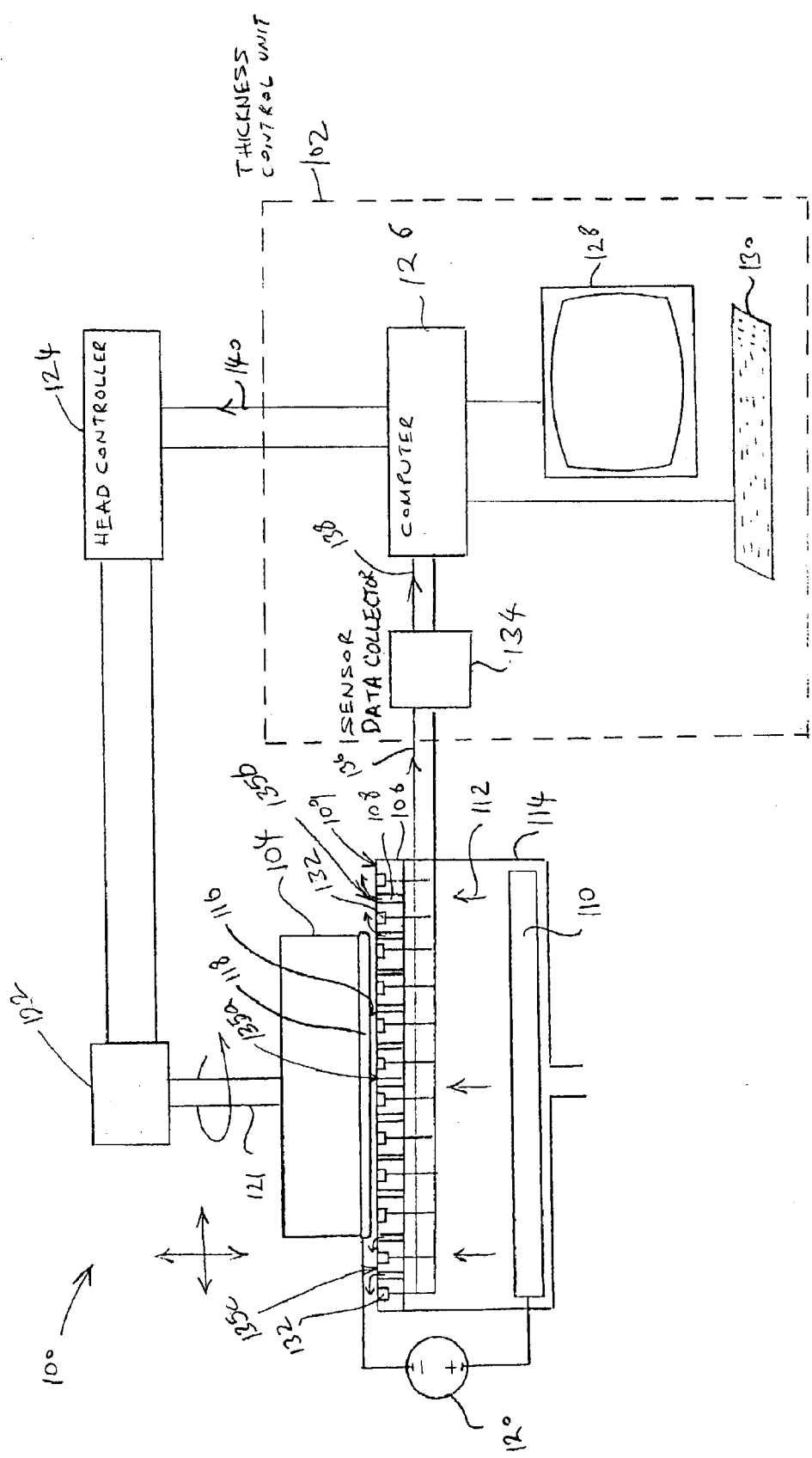
FIG. 4 illustrates a system according to the present invention that includes an ECMPR system and a thickness profile control unit.
Figure 5:
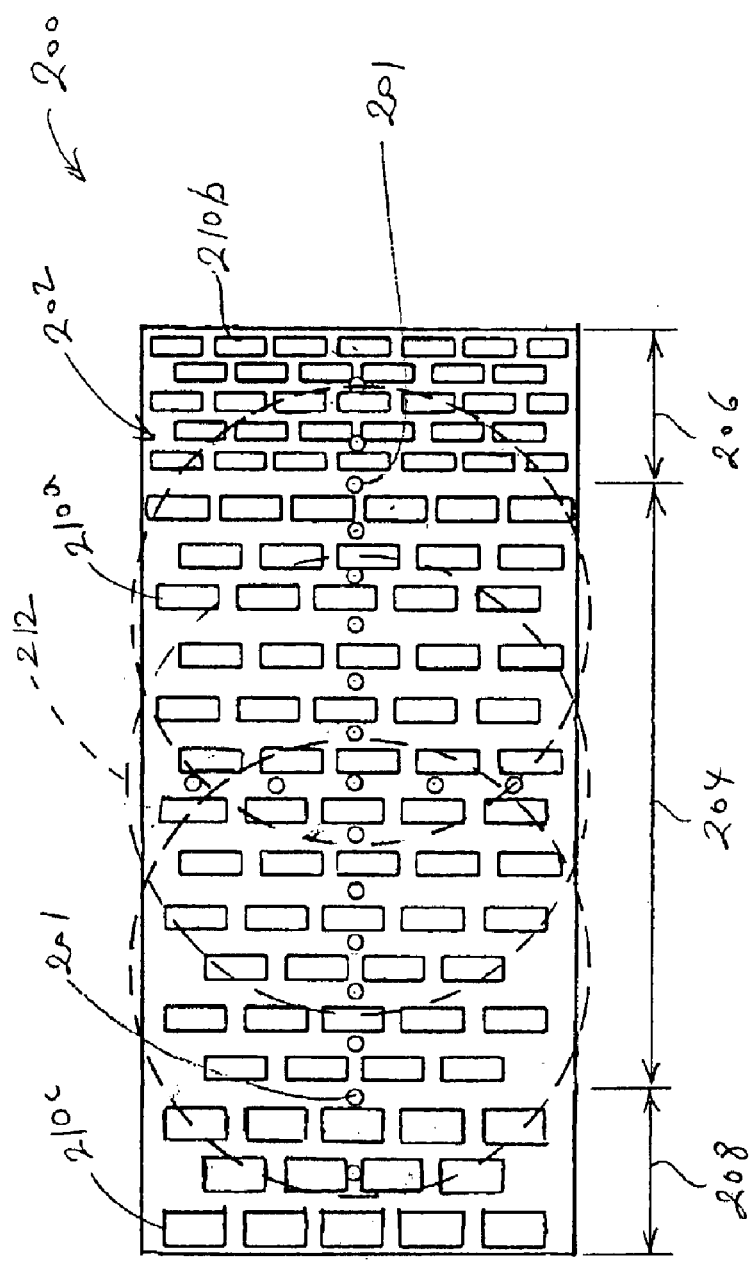
FIG. 5 illustrates an exemplary WSID according to the present invention.

FIG. 4 illustrates an ECMPR system 100 having a thickness profile control unit 102. The ECMPR system 100 may comprise a carrier head 104, a WSID 106 having channels 108 or openings and a surface 109. In this embodiment the WSID 106 is the thickness profile control member to obtain desired thickness profile on a wafer. The openings 108 of the WSID 106 may have different sizes and shapes that affect deposition or etching rate (FIG. 5). As will be described below, in this embodiment, openings 108 may having the same size or different sizes, but for different areas they provide the overall desired effect for that area relative to another area. Openings 108 may also have the same shape, but they may be grouped over a number of the surface locations of the WSID 106 so as to change the deposition or etching rates at those locations. The system 100 comprises an electrode 110 immersed in a process solution 112, which is contained in a container 114. A front surface 116 of a wafer 118 to be processed is held by the carrier head 104. Electrode 110 and the front side of the wafer are connected to the opposite terminals of a power supply 120. The wafer 118 may be a preprocessed silicon wafer having features or cavities such as vias or trenches lined with a barrier layer and a copper seed layer (not shown). The carrier head 104 is rotated, laterally or vertically moved, as suggested by the arrows, by a shaft 121 that is connected to a carrier head motor 122 which is controlled by a carrier head control unit 124.

The thickness profile control unit 102 may comprise a computer 126 with a CPU (not shown) and a memory unit (not shown), a monitor 128 and input devices such as a keyboard 130 or a pointing device (not shown). The computer 126 is connected to a series of sensors 132 through a sensor data collector 134. The sensors 132 are placed in the WSID, preferably distributed right below the surface 109 of the WSID 106. However, the sensors 132 can be also located in the carrier head 104. According to the present embodiment, sensors detect the thickness of the deposited or removed layer in real time, while the wafer is processes, and supply this information to the computer through the sensor data collector 134. Although many sensors are shown in FIG. 4, as few as two sensors, one near the edge area and one near the center of the wafer, may be utilized. The computer 126 continuously evaluates the supplied thickness data and, based on this data, selectively readjusts the deposition or removal rates at the various locations on the wafer surface to obtain the desired thickness profile.

As mentioned, in this embodiment, the thickness profile of the processed layer can be changed by processing the wafer over different locations of the WSID. For example, the desired thickness profile of the processed layer is configured by initially processing the wafer surface on a first surface location 135a of the WSID and, as the thickness data is derived, subsequent processing may bring a portion such as the edge of the wafer surface either on a second surface location 135b or a third surface location 135c of the WSID. The first location may generally be the area on the WSID, which is directly under the wafer. The second and third locations may be located at the right and left sides of the first location. As will be described below, each surface location may include different size openings and thereby different deposition or etching rates. Exemplary sensors that can be used in this embodiment may be acoustic sensors, or eddy current sensors with ability to measure absolute or relative thickness of conductive layers on a wafer. Such sensors are well known in the field.

In an exemplary operation, the sensor data collector receives input signals 136 from the sensors 132 while the wafer is being processed on the first surface location of the WSID. The input signals carry thickness data of the front surface of the wafer. The controller 134 then sends an output signal 138, which is received by the computer 126. The computer 126, using a suitable software, analyzes the thickness data from the signal 138 and prepares, for example, a surface thickness graph or map showing the surface thickness profile, if there is any, with thin or thick areas. Before processing the wafer, the computer may have been provided with the desired thickness profile by the operator. Then, based on the information received from signal 138, the computer compares the actual thickness profile evolution on the wafer surface, compares it with the desired thickness profile in its memory and sends a carrier head control signal 140 to the carrier head controller 124 to move the head and the wafer partially onto the second or third locations of the WSID to compensate for any discrepancy between the desired thickness profile and the evolving thickness profile. As the wafer is rotated, the portion of the wafer, that is advanced into the second or third locations, is processed under higher or lower deposition or etching rates to obtain uniformity across the entire wafer surface or to obtain the desired profile, may it be edge high or edge low or flat. As in the examples before, this can be done either by momentarily advancing the wafer onto the second and third locations or by scanning the part of the wafer between the first and second or third locations. As the process continues, the above-described steps may be repeated until the desired thickness profile or the uniformity is obtained.

FIG. 5 illustrates an exemplary WSID 200, to be used as a thickness profile control member including sensors 201. In this embodiment, the WSID 200 can be incorporated into the system 100 described above, and also the sensors 201. In this embodiment, the WSID 200 can be incorporated into the system 100 described above, and also the sensors 201 can be connected to measure film thickness on the wafer continually or at selected intervals. The WSID has a surface 202 divided into a first surface location 204, a second surface location 206 and a third surface location 208. In this embodiment, the first surface location 204 may have medium size openings 210a or holes to obtain an average deposition or etching rate. The second surface location may have small 206 may have small size openings 210b to obtain a deposition or etching rate that is lower than the medium size openings. The third surface location 208 may be large size openings 210c to obtain deposition and etching rates that are higher than the medium size openings. In this respect, the second surface location 206 is a low deposition or etch rate location and the third surface location 208 is a high deposition or etch rate location. Sensors 201 are distributed along the locations 204–208 to collect thickness data from the surface of the wafer during the process.

Other embodiments of the WSID can include more or less surface locations or even a graduated WSID pattern of openings that varies from smaller to larger. Such alternative embodiments of the WSID are also within the spirit of the present invention.

Figure 6A:
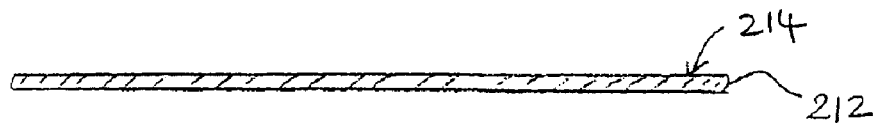
FIGS. 6A–6D illustrate various thickness profile examples achievable through implementation of the present invention.

The process sequence on the WSID 200 may be exemplified by processing, for example ECMD processing, a wafer 212 on the first surface location 204. Referring to FIGS. 5 and 6A, a front surface 214 of the wafer 212 is preprocessed as described above so that copper can be electroplated using ECMD on the front surface 214.

Figure 6B:
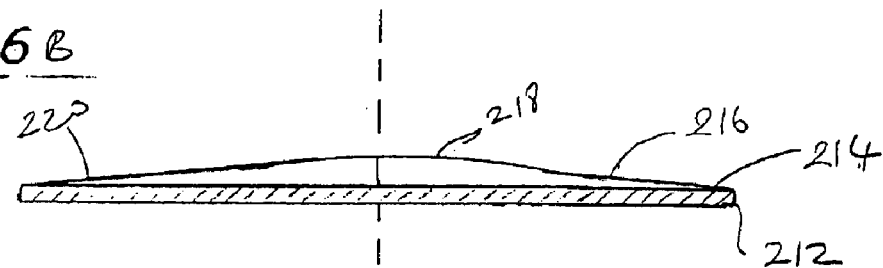
Figure 6C:
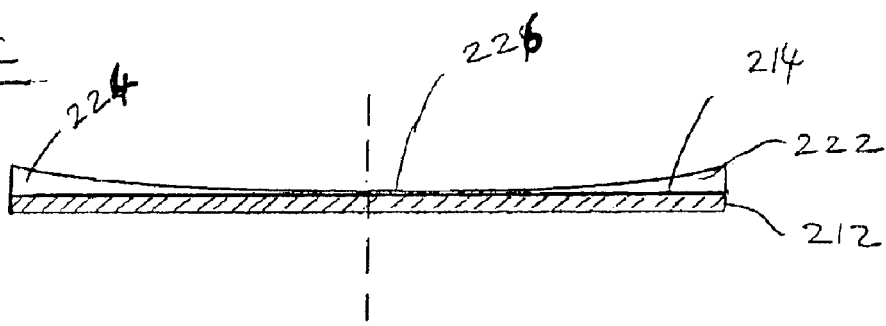
Figure 6D:

Inventive aspects of the present invention may be described in connection with FIGS. 6B, 6C and 6D which illustrate some thickness profile examples. In order to better illustrate the invention, the profiles in FIGS. 6B–6D are greatly exaggerated. FIG. 6B illustrates a copper layer 216 with a center thick or edge thin thickness profile which can be formed as an edge area 220 of the wafer 212 is processed between the first and second locations 204, 206 while a center area 218 of the wafer is substantially kept within the first location 204. During the process, the center area 218 of the layer 216 grows thicker than the edge area 220 of the layer 216 because the second area has smaller openings, and hence receives reduced deposition rate, than the first area 204. The edge area may be advanced into the second location and kept there for a period or it may be scanned in and out of that area with a scanning action as described above. With the reduced deposition rate of the second location 206, the edge area 220 grows slower than the center area 218 while this growth is simultaneously observed by the sensors 201. The head controller works in conjunction with the computer to determine how the wafer should be scanned to obtain the desired profile of 6B.

Similarly FIG. 6C illustrates a copper layer 222 which may be formed as the edge area of the wafer 224 is processed between the first and third locations 204, 208. During the process, thickness of the edge area 224 becomes higher than the center area 226 of the layer 222. During the process, the edge area 226 of the layer 222 is advanced onto the higher deposition rate location 208 of the WSID (see also FIG. 5) at least during a part of the process time.

FIG. 6D illustrates an exemplary layer 230 having a uniform thickness profile that is formed by either processing the wafer at the first location or scanning it between the first, second and third locations 204, 206, 208 shown in FIG. 5. Again, control of this scanning is provided by the computer as discussed previously.

As described before, the openings within various portions of the plate can be the same or different sizes, and the flow rate may be controlled through different portions. Further, different features in the various embodiments described above can be combined in order to affect the advantages discussed herein.

In accordance to another embodiment of the present invention and in reference to FIG. 4, the computer 126 includes storage for a plurality of thickness profile data that establishes a relationship between the deposition rate on various areas on the wafer surface and the process location of the wafer with respect to the thickness profile control member. The thickness profile data are preprogrammed routines that controls the ECMPR system. Each thickness profile data includes program instructions that will control the ECMPR system to process a front surface 116 of a wafer 118 in a particular manner, such as at particular locations over the WSID for particular process durations, resulting in a particular thickness profile. For example, using the keyboard 130 and monitor 128 interface to the computer 126, an operator can select a particular thickness profile data for execution by the computer 126 to obtain a particular thickness profile for a front surface of a wafer. It should be noted that the thickness profiles attainable would not be limited to the profiles in the memory. Since the computer has the information of processing rate at various process locations, by mixing the process conditions available in the memory, the computer can calculate and determine the combinations of process conditions necessary to get the desired or requested thickness profile.

Although various preferred embodiments have been described in detail above, those skilled in the art will readily appreciate that many modifications of the exemplary embodiment are possible without materially departing from the novel teachings and advantages of this invention.

What is claimed is:

1. A method of controlling a thickness profile of a conductive layer on a surface of a workpiece during an electrochemical process, using a thickness profile control member including a plurality of surface locations configured to change the thickness profile of the conductive layer, the method comprising:

placing the surface of the workpiece in proximity of the thickness profile control member at a first position;

establishing relative motion between the conductive layer and at least one surface location of the thickness profile control member;

processing the conductive layer at the first position to obtain a particular thickness profile for the conductive layer;

sensing the conductive layer to record at least one thickness measurement for the conductive layer;

laterally moving the workpiece to a second position in proximity of the thickness profile control member; and processing the conductive layer at the second position to generate a predetermined thickness profile for the conductive layer.

2. The method of claim 1 further comprising the step of generating a thickness profile based on the at least one thickness measurement of the conductive layer on the workpiece.

3. The method of claim 2, wherein the step of generating the thickness profile and sensing the conductive layer are repeated to produce the thickness profile.

4. The method of claim 1 wherein the thickness profile control member provides a graduated processing rate as a function of distance.

5. The method of claim 4, wherein the graduated processing rate includes a graduated flow rate of a process solution.

6. The method of claim 4, wherein the graduated processing rate includes a graduated pattern of openings ranging from smaller to larger.

7. The method of claim 1, wherein the step of establishing the relative motion includes a rotational motion between the conductive layer and the at least one surface location of the thickness profile control member.

8. The method of claim 7, wherein the step of establishing the relative motion includes a linear motion substantially parallel to the at least one surface location of the thickness profile control member.

9. The method of claim 7, wherein the step of establishing relative motion includes varying a gap between the surface of the workpiece and the thickness profile control member.

10. The method of claim 7, wherein the step of establishing relative motion includes oscillating the surface of the workpiece with respect to the thickness profile control member.

11. The method of claim 1, wherein the thickness profile control member includes an electrode.

12. The method of claim 1, wherein the electrochemical process includes a material deposition process.

13. The method of claim 1 wherein the electrochemical process includes a material removal process.

14. An electrochemical process for generating a thickness profile of a conductive layer on a surface of a workpiece, using a thickness profile control member including a plurality of surface locations configured to change a surface profile of the conductive layer, the process comprising:

processing the conductive layer at least one surface location of the thickness profile control member;

obtaining a thickness profile of the conductive layer; and laterally moving the conductive layer relative to the at least one surface location of the thickness profile control member in response to the thickness profile.

15. The electrochemical process of claim 14 further comprising a thickness profile storage for storing a plurality of selectable thickness profiles.

16. The electrochemical process of claim 15, wherein the step of moving the conductive layer relative to the at least one surface location of the thickness profile control member is in response to a selected thickness profile from the plurality of selectable thickness profiles.

17. The electrochemical process of claim 14, wherein the electrochemical process includes a material deposition process or removal process.

18. The electrochemical process of claim 17, wherein the material is copper.

19. The electrochemical process of claim 14, wherein the thickness profile control member includes an electrode.

20. The electrochemical process of claim 19, wherein a distance between the electrode and the conductive layer on the workpiece is varied.

21. The electrochemical process of claim 14, wherein the thickness profile control member is an electrode.

22. A system for electrochemical processing a conductive layer of a workpiece comprising:

a thickness profile control member having a plurality of surface locations configured to change a surface profile of the conductive layer;

a workpiece holder for laterally moving the conductive layer over the thickness profile control member, the workpiece holder configured to produce relative motion between the workpiece and at least one surface location on the thickness profile control member; and a workpiece controller coupled to the workpiece holder and configured to control the relative motion between the workpiece holder and the plurality of surface locations on the thickness profile control member in response to a predetermined thickness profile data.

23. The system of claim 22 further comprising means to move the thickness profile control member.

24. The system of claim 22 further comprising at least one sensor configured to provide at least one thickness measurement of the conductive layer and a sensor data collector coupled to the at least one sensor and configured to generate a present thickness profile data in response to the at least one thickness measurement received from the at least one sensor.

25. The system of claim 24, wherein the sensor data collector receives a plurality of thickness measurements from the at least one sensor to generate the present thickness profile data.

26. The system of claim 24 further comprising a computer coupled to the workpiece controller and the sensor data collector and configured to control the workpiece controller in response to a comparison of the predetermined thickness profile data with the present thickness profile data.

27. The system of claim 26, wherein the computer includes storage for a plurality of selectable thickness profile data.

28. The system of claim 22, wherein the thickness profile member includes an electrode.

29. The system of claim 28, wherein a distance between the electrode and the conductive layer on the workpiece is varied.

30. The system of claim 22, wherein the electrochemical processing of the conductive layer is a material deposition process or a material removal process.

31. The system of claim 30, wherein the material is copper.

* * * * *